United States Patent

Wu

[11] Patent Number: 6,008,090
[45] Date of Patent: Dec. 28, 1999

[54] METHOD OF FORMING HIGH DENSITY FLASH MEMORIES WITH HIGH CAPACITIVE-COUPING RATIO AND HIGH SPEED OPERATION

[76] Inventor: Shye-Lin Wu, No. 6 Creation Rd. 2. Science-Based Industrial Park, Hsinchu, Taiwan

[21] Appl. No.: 09/261,027

[22] Filed: Mar. 2, 1999

Related U.S. Application Data

[63] Continuation-in-part of application No. 09/036,027, Mar. 6, 1998, Pat. No. 5,970,342.

[51] Int. Cl.[6] .................................................. H01L 21/8247
[52] U.S. Cl. ........................... 438/260; 438/201; 438/211; 438/594
[58] Field of Search .................................... 438/260, 257, 438/259, 263, 264, 201, 211, 253, 396, 238, 239, 233, 297, 594

[56] References Cited

U.S. PATENT DOCUMENTS

| | | | |
|---|---|---|---|
| 5,079,180 | 1/1992 | Rodder et al. | 438/297 |
| 5,683,924 | 11/1997 | Chan et al. | 438/297 |
| 5,877,052 | 3/1999 | Lin et al. | 438/238 |
| 5,918,125 | 6/1999 | Guo et al. | 438/264 |
| 5,930,617 | 7/1999 | Wu | 438/233 |

*Primary Examiner*—Olik Chaudhuri
*Assistant Examiner*—Anh Duy Mai
*Attorney, Agent, or Firm*—Harness, Dickey & Pierce, P.L.C.

[57] ABSTRACT

The method of the present invention includes patterning a gate structure. Then, a polyoxide layer is formed on side walls of the gate structure. Then, silicon nitride side wall spacers is formed on the side walls of the gate structure. Then, source/drain structure of the device is fabricated. Next, the side wall spacers is removed to expose a portion of the source and drain. Then, an undoped amorphous silicon layer is formed on the surface of the gate structure, the oxide layer and the exposed source and drain. A dry oxidation process is used to convert the amorphous silicon layer into textured tunnel oxide at the interface of the substrate and the oxide. A polysilicon layer is than formed, followed by chemical mechanocal polishing the layer. A rugged silicon layer is subsequently deposited over the gate and the polished polysilicon. Then, the floating gate is defined. A dielectric is formed at the top of the rugged silicon. A conductive layer is formed on the dielectric layer as a control gate.

22 Claims, 4 Drawing Sheets ically placing charge on and removing the charges from the floating gate. One of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. Bergemont proposed another cell array for portable computing and telecommunications application, which can be seen in Bergmont et al., "Low Voltage NVG™ : A New High Performance 3 V/5 V Flash Technology for Portable Computing and Telecommunications Applications", IEEE Trans. Electron Devices, vol. ED-43, p. 1510, 1996. This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the field of integrated circuits. In the article, the access time is one of the key concerns for low voltage read operation. The NVG array uses select devices to achieve a fast access time by reducing the pre-charge time to that of a single segment rather than the full bit-line.

METHOD OF FORMING HIGH DENSITY FLASH MEMORIES WITH HIGH CAPACITIVE-COUPING RATIO AND HIGH SPEED OPERATION

This is a continuation-in-part application of Ser. No. 09/036,027 filed Mar. 6, 1998, now U.S. Pat. No. 5,970,342, entitled "METHOD OF FORMING HIGH CAPACITIVE-COUPLING RATIO AND HIGH SPEED FLASH MEMORIES WITH A TEXTURED TUNNEL OXIDE".

FIELD OF INVENTION

The present invention relates to a semiconductor device, and more specifically, to a method of fabricating flash memories.

BACKGROUND OF THE INVENTION

Various nonvolatile memories have been disclosed in the prior art. For example, Mitchellx has proposed EPROMs with self-aligned planar array cell. In this technique, buried diffusion self-aligned to the floating gate avalanche injection MOS transistor are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553, 1987".

Flash memory is one of the segments of nonvolatile memory devices. The device includes a floating gate to store charges and an element for electrically placing charge on and removing the charges from the floating gate. One of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. Bergemont proposed another cell array for portable computing and telecommunications application, which can be seen in Bergmont et al., "Low Voltage NVG™ : A New High Performance 3 V/5 V Flash Technology for Portable Computing and Telecommunications Applications", IEEE Trans. Electron Devices, vol. ED-43, p. 1510, 1996. This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the field of integrated circuits. In the article, the access time is one of the key concerns for low voltage read operation. The NVG array uses select devices to achieve a fast access time by reducing the pre-charge time to that of a single segment rather than the full bit-line.

The formation of nonvolatile memories toward the trends of low supply power and fast access, because these requirements are necessary for the application of the mobile computing system. One important key parameters of high performance memory is capacitive-coupling ratio. Prior art proposed a structure to increase the capacitive-coupling ratio by using hemispherical grained (HSG) silicon to increase the surface area of floating gate. Buried n+ diffusion layers are formed with self-aligned arsenic ion implantation and the cell structure works at 3V. Please see Shirai, et al., "A 0.54 $\mu m^2$ Self-Aligned, HSG Floating Gate Cell for 256 Mbit Flash Memories", IEDM Tech. Dig., p. 653, 1995.

Flash memory needs the charges to be hold in the floating gate for a long periods of time. Therefore, the dielectric that is used for insulating the floating gate needs to be high performance. At present, the low voltage flash memory is applied with a voltage of about 3V or 5V during charging or discharging the floating gate. As known in the art, tunneling is a basic technology in charging or discharging. In order to attain high tunneling efficiency, the thickness of the dielectric between the floating gate and substrate have to be scaled down due to the supply voltage is reduced. However, it will degrade the reliability of the dielectric when the thickness of the dielectric is scaled down below 10 nm. These can refer to articles "Flash Technology: Challenge and Opportunities", Raghupathy V. Giridhar, Jap. J. Appl. Phys. Vol. 35 pp. 6347–6350 (1996) and K. Yoshikawa et al., "Comparison of Current Flash EEPROM Erasing Methods: Stability and How to cotrol", IEDM, Tech. Dig., p 595, 1992.

SUMMARY OF THE INVENTION

The method of the present invention includes forming a gate oxide layer on a substrate. Subsequently, a doped polysilicon layer is deposited on the gate oxide layer. Then, a silicon nitride layer is deposited on the polysilicon layer to improve the resolution of lithography. An etching step is used to etch the silicon nitride layer, polysilicon layer and gate oxide for forming a gate structure. A dielectric layer is formed on the substrate. Then, a polyoxide layer is simultaneously formed on side walls of the gate structure in the procedure.

Then, a silicon nitride layer is formed on the surface of the substrate. Successively, the dielectric layer is etched back to form side wall spacers on the side walls of the gate structure. Thus, only the portions of the oxide under the side wall spacers are left. The source/drain structure of the device is fabricated using conventional masking and ion implantation steps. A high temperature oxidation is performed to drive dopants deeper into the substrate.

The next step is to remove the side wall spacers and the oxide layer to expose a portion of the source and drain. The silicon nitride layer and polyoxide layer are also stripped, thereby exposing the gate structure. Then, an undoped amorphous silicon layer is formed on the surface of the gate structure, the oxide layer and the exposed source and drain. A dry oxidation process is used to convert the amorphous silicon layer into textured tunnel oxide at the interface of the substrate and the oxide. Next, a polysilicon layer is deposited on the patterned polysilicon and the oxide layer. Subsequently, a chemical mechanical polishing (CMP) technique is used to polish the polysilicon layer. The oxide at the top of the gate is removed during the CMP process.

A rugged silicon layer is then deposited on the polysilicon layer. For example, a HSG-Si layer can be utilized to act as the rugged polysilicon. The floating gate is consisted of the gate, the polysilicon layer and the HSG-Si layer. Then, the floating gate is patterned An inter polysilicon dielectric (IPD) is formed at the top of the floating gate for isolation. Finally, a conductive layer, such as n+ doped polysilicon layer, silicide metal, or metal nitride is formed on the IPD as control gate. A patterning technique is used to pattern the layers to form the device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
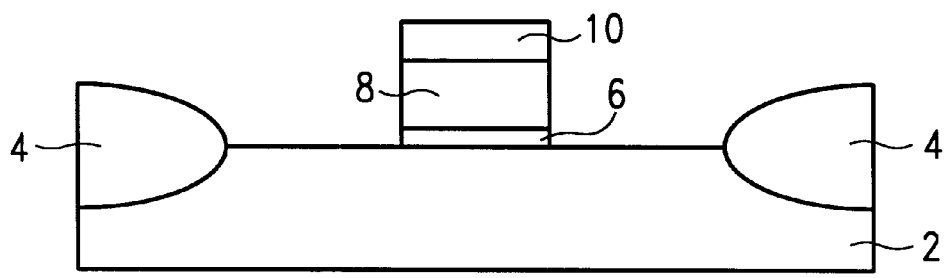
FIG. 1 is a cross sectional view of a semiconductor wafer illustrating the steps of forming a gate structure on a semiconductor substrate according to the present invention.

The present invention proposes a novel method to fabricate a high density flash nonvolatile memory with high capacitive-coupling ratio and high speed operation. In the method, an undoped hemispherical grained silicon (HSG-Si) or amorphous silicon will be used to form a textured tunneling oxide to enhance the electron tunneling efficiency. The structure can increase the device operation speed. The textured structure is constructed by the rapid diffusion of oxygen through the grain boundaries of the silicon film into silicon substrate. Furthermore, the HSG-Si is also introduced in the application to act as a part of the floating gate. Thus, the floating gate has a larger surface. The detailed description will be seen as follows.

A semiconductor substrate is provided for the present invention. In a preferred embodiment, as shown in the FIG. 1, a single crystal silicon substrate 2 with a <100> crystallographic orientation is provided. A plurality of isolations 4 between devices are formed on the substrate 2. In general, field oxide (FOX) isolation or shallow trench isolation techniques can be introduced to serve as the isolations 4. For example, the FOX regions 4 can be formed via lithography and etching steps to etch a silicon nitride/silicon dioxide composition layer. After the photoresist is removed and wet cleaned, thermal oxidation in steam environment is used to grow the FOX regions 4. As known in the art, a shallow trench isolation technique can be used to replace the FOX.

A thin gate oxide layer 6 consisted of silicon oxide is formed on the substrate 2. Typically, the gate oxide 6 can be grown in $O_2$, $N_2O$, NO or $NO+O_2$ ambient at a temperature of about 700 to 1100 degrees centigrade. Other method, such as chemical vapor deposition, can also form the gate oxide 6. In the embodiment, the thickness of the silicon dioxide layer 6 is approximately 15–250 angstroms. Subsequently, an n+ doped polysilicon layer 8 is deposited on the gate oxide layer 6. The n+ doped polysilicon layer 8 can be doped by phosphorus using a $PH_3$ source. Then, a silicon nitride layer ($SiN_x$) 10 is deposited on the polysilicon layer 8 for acting as an anti-reflective coating (ARC) layer to improve the resolution of lithography. Any suitable process can be used to form the silicon nitride layer 10. As known by a person of ordinary skills in the art, the silicon nitride layer 10 can be formed using Low Pressure Chemical Vapor Deposition (LPCVD), Plasma Enhance Chemical Vapor Deposition (PECVD), and so on. Further, the temperature forming the silicon nitride layer 10 is at a range of 300–800 degrees centigrade. In the preferred embodiment, the reaction gases of the step to form silicon nitride layer 10 are $SiH_4$, $NH_3$, $N_2$, $N_2O$ or $SiH_2Cl_2$, $NH_3$, $N_2$, $N_2O$. In addition, ultra thin silicon nitride formed by jet vapor deposition (JVD) can be selected as the gate dielectric. The JVD nitride exhibit excellent electrical properties. Compared to thermal oxide, the JVD nitride include lower leakage current and higher resistant to boron penetration. The JVD nitride can be deposited at room temperature using JVD technique, followed by annealing at about 800 to 850 centigrade degrees.

Next, still referring to FIG. 1, standard lithography and etching steps are used to etch the silicon nitride layer 10, polysilicon layer 8 and gate oxide 6 to the surface of the substrate 2 for forming a gate structure.

Figure 2:
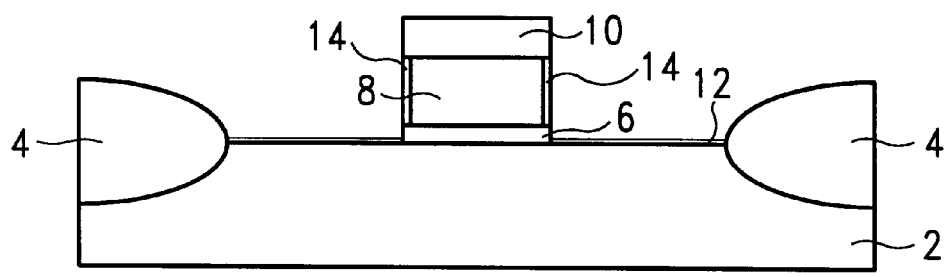
FIG. 2 is a cross sectional view of a semiconductor wafer illustrating the step of forming polyoxide according to the present invention.

Turning to FIG. 2, subsequently, an ultra thin dielectric layer, such as silicon oxynitride layer 12, is formed on the substrate 2 where is exposed by the gate structure. In a case, the silicon oxide layer 12 is formed by thermal oxidation in $N_2O$ or NO environment. This can also be done in $N_2$ and $O_2$ ambient. The temperature for forming the silicon oxide layer 12 ranges from 700 to 1150 degrees centigrade. The thickness is preferably about 25 to 150 angstroms. Further, a polyoxide layer 14 is simultaneously formed on side walls of the gate structure in the procedure.

Figure 3:
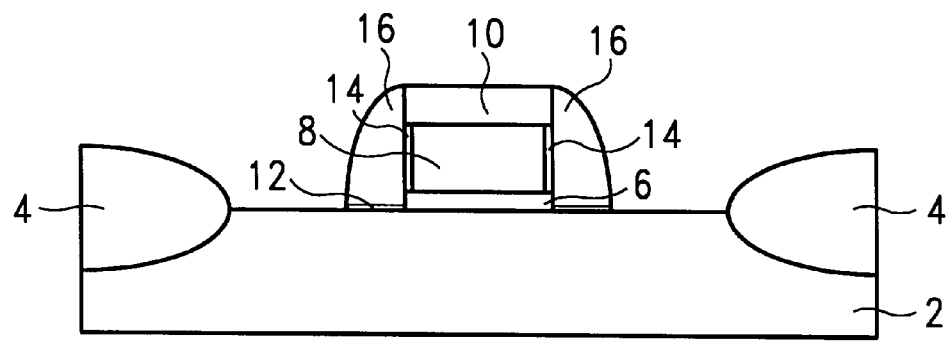
FIG. 3 is a cross sectional view of a semiconductor wafer illustrating the step of forming silicon nitride side wall spacers according to the present invention.

Then, side wall spacers 16 are formed on the side walls of the gate structure for isolating, as shown in FIG. 3. In order to achieve this, a dielectric layer, such as silicon nitride layer, is formed on the surface of the substrate 2 and along a surface of the gate structure. Successively, the dielectric layer is anisotropically etched by using an anisotropical etching process to construct the side wall spacers 16. In a case, the dielectric layer can be formed of silicon nitride layer, which is formed by using aforesaid method. Thus, only the portions of the oxide 12 under the side wall spacers 16 are left and adjacent to the gate oxide 6.

Figure 4:
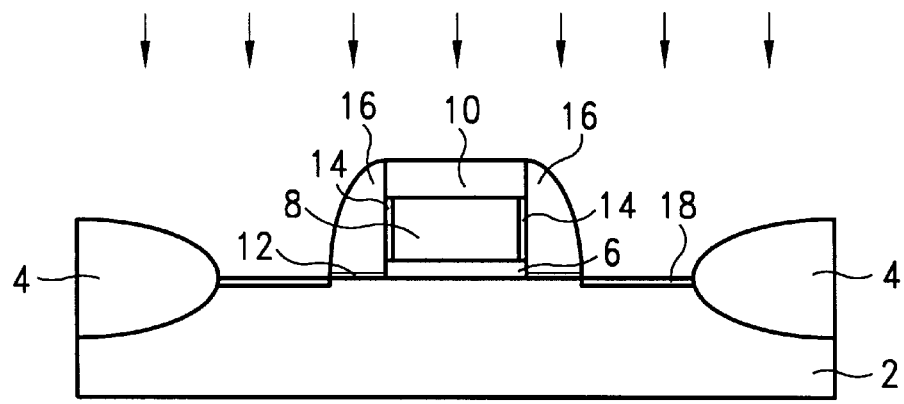
FIG. 4 is a cross sectional view of a semiconductor wafer illustrating the step of forming source and drain according to the present invention.

The source/drain structure of the device may now be fabricated using conventional masking and ion implantation steps. Please turn to FIG. 4. An ion implantation is carried out to dope dopants into the substrate 2 by using the gate structure and side wall spacers 16 as a mask. In this step, a buried conductive diffusion layer 18 is formed in the substrate 2 adjacent to the gate structure to serve as source and drain. For example, n type conductive dopants may be used for the implantation. The source and drain 18 are formed by a conventional ion implantation with n conductive type dopants such as phosphorus or arsenic at a dose about 2E15 to 5E16 atoms/cm$^2$, and an energy is about 0.5 to 120 KeV. It should be well understood by those skill in the art that a p type conductive dopants could be used by simply substituting opposite dopants to those given for the aforesaid step.

Figure 5:
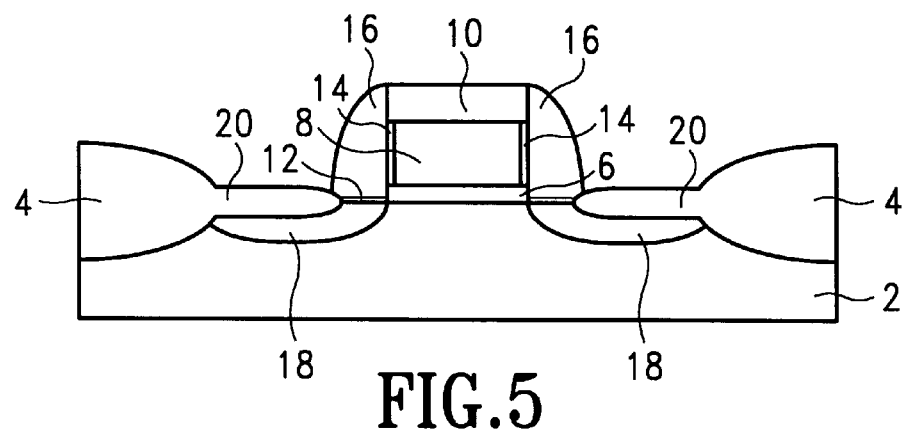
FIG. 5 is a cross sectional view of a semiconductor wafer illustrating the step of performing a thermal process to drive the dopants into the substrate according to the present invention.

Turning to FIG. 5, a high temperature oxidation is performed to drive dopants deeper into the substrate 2. In the same time, an oxide layer 20 having a thickness about 500 to 2000 angstroms is grown on the top of the source and drain 18 that are exposed by the gate structure and the isolating spacers 16.

Figure 6:
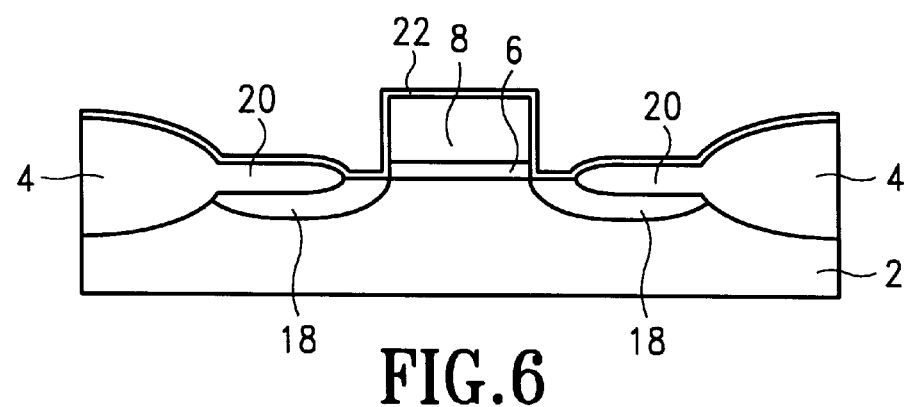
FIG. 6 is a cross sectional view of a semiconductor wafer illustrating the steps of forming an amorphous silicon layer according to the present invention.

Turning to FIG. 6, the following step is to remove the side wall spacers 16 and the silicon nitride layer 10. The oxide layer 12 that is uncovered by the gate and the polyoxide layer 14 are then stripped, thereby exposing the gate structure and expose a portion of the source and drain 18. In the embodiment, the silicon nitride can be removed by using hot phosphorus acid solution. Using HF solution or BOE (buffer oxide etching) solution can strip the oxide layer. Then, an undoped thin amorphous silicon layer 22 is formed on the surface of the gate structure, the oxide layer 20 and the exposed source and drain 18. The thickness of the undoped amorphous silicon layer 22 is about 20 to 200 angstroms. Further, hemispherical grained silicon (HSG-Si) can be used to replace the amorphous silicon layer 22. The amorphous silicon 22 is formed in a furnace at about 400 to 600 degrees centigrade in an ambient containing $SiH_4/N_2$.

Figure 7:
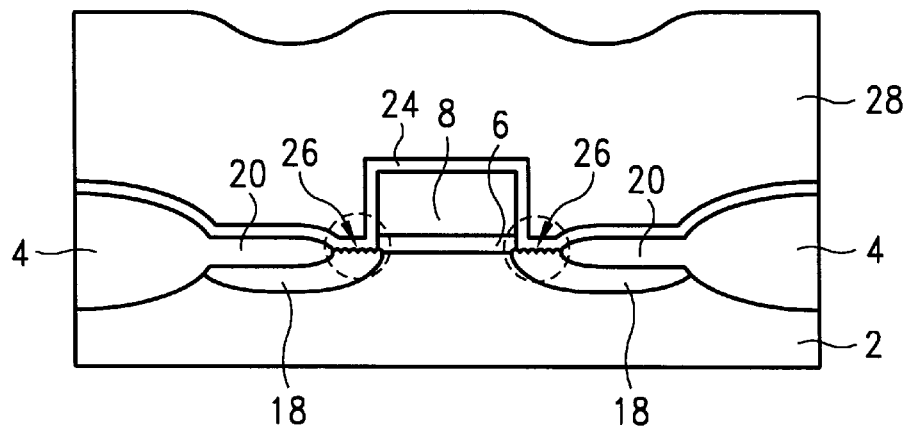
FIG. 7 is a cross sectional view of a semiconductor wafer illustrating the steps of forming a textured tunneling oxide and a further polysilicon layer according to the present invention.

Turning to FIG. 7, a dry oxidation process is introduced at 700 to 1000 degrees centigrade in $O_2$ ambient to convert the amorphous silicon layer 22 into textured tunnel oxide 24 with textured profile 26 at the interface of the substrate 2 and the oxide 24. This structure is referred to TOPS (thermally oxidizing a polysilicon film on silicon substrate). The mechanism of forming the textured structure is the rapid diffusion of oxygen through the grain boundaries of the silicon film into silicon substrate 2 and the enhanced oxidation rate at the grain boundaries. Therefore, a textured silicon/oxide interface is achieved. The textured interface 26 results in localized high fields and enhances the electron injection into TOPS. The tunneling oxide 24 having textured interface 26 has a higher electron conduction efficiency and lower electron trapping rate. This can refer to an article proposed by S. L. Wu, "Characterization of Thin Textured Tunnel Oxide Prepared by Thermal Oxidation of Thin Polysilicon Film on Silicon", IEEE, Trans. Electron Devices, vol. ED-43, pp. 287–294, 1996.

The present invention has high capacitive-coupling ratio due to the extended area of the floating gate, therefor it can be used for low power operation. Further, the present invention exhibits high speed and low power operation due to the high electron injection efficiency of textured tunnel oxide. The read or write speed is higher than the conventional structure in read, and write modes. Next, another n+ doped polysilicon layer 28 is deposited on the patterned polysilicon 8 and the layer 24.

Figure 8:
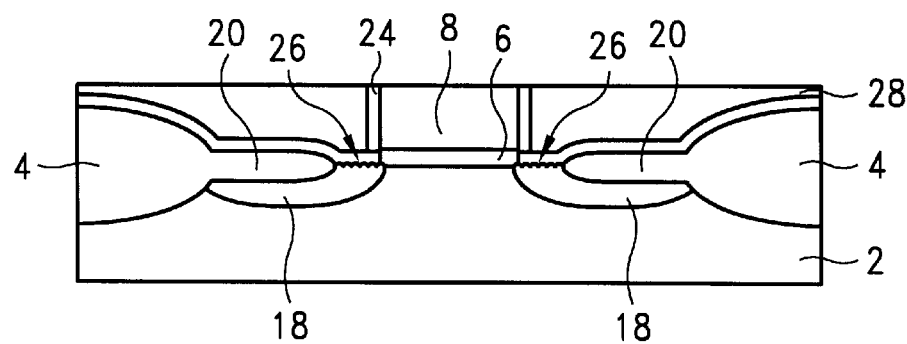
FIG. 8 is a cross sectional view of a semiconductor wafer illustrating the step of performing a chemical mechanical polishing to polish the polysilicon layer according to the present invention.
Figure 9:
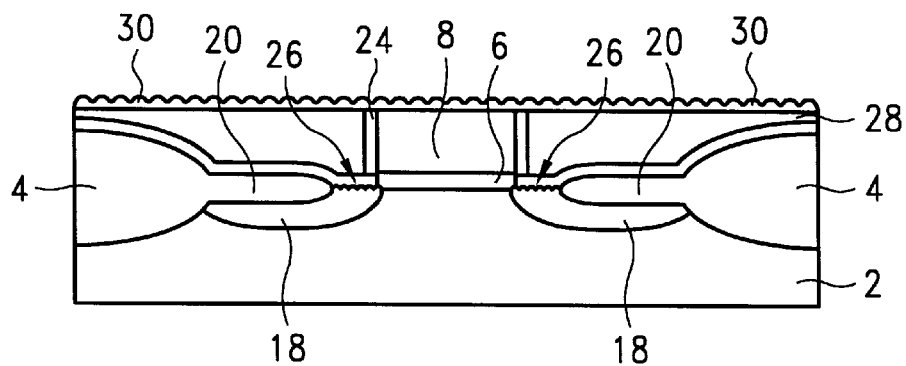
FIG. 9 is a cross sectional view of a semiconductor wafer illustrating the step of forming a rugged polysilicon according to the present invention.
Figure 10:
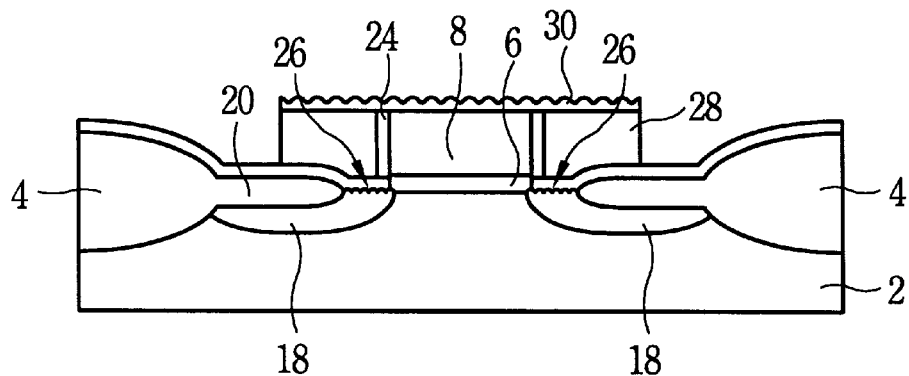
FIG. 10 is a cross sectional view of a semiconductor wafer illustrating the step of defining the floating gate according to the present invention.

As shown in FIG. 8, subsequently, a chemical mechanical polishing (CMP) technique is used to polish a portion of the polysilicon layer 28. The oxide 24 at the top of the gate 8 is also removed during the CMP process, as shown in the scheme. The polysilicon layer 28 is separated into two parts adjacent to said gate structure in a cross-sectional view. A conductive structure is established to connect these parts and further to increase the surface of the subsequent floating gate. One of the methods to obtain the benefit is to form a rugged silicon layer 30 on the polysilicon layers 8 and 28. For example, a HSG-Si layer 30 can be utilized to act as the rugged polysilicon. The HSG-Si layer 30 includes n+ type conductive dopants in the case. FIG. 9 shows the resulting scheme after the step. The floating gate is consisted of the gate 8, the polysilicon layer 28 and the HSG-Si layer 30. The layer 30 sufficiently increases the surface area of the floating gate. Thus, the device formed by the present invention can gain the benefit of smaller size than conventional for similar capacitance of the devices due to the HSG-Si enlarges the surface. Then, an etching is performed to etch the polysilicon 28 and the rugged silicon layer 30 thereby defining the gate structure, as shown in FIG. 10.

Figure 11:
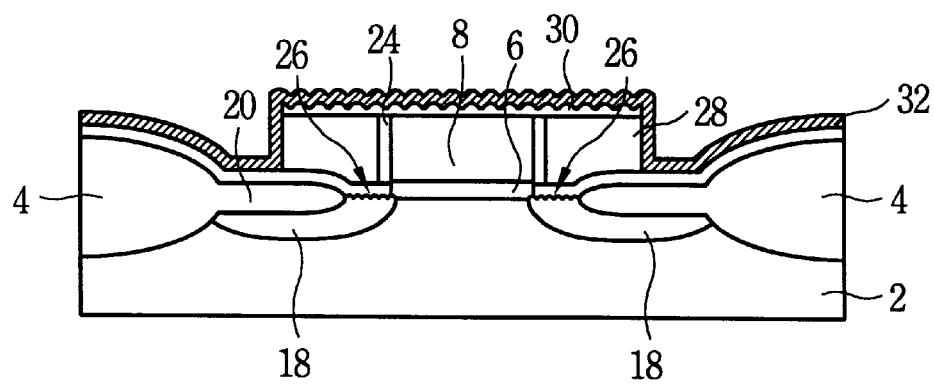
FIG. 11 is a cross sectional view of a semiconductor wafer illustrating the step of forming a dielectric layer on the floating gate according to the present invention.
Figure 12:
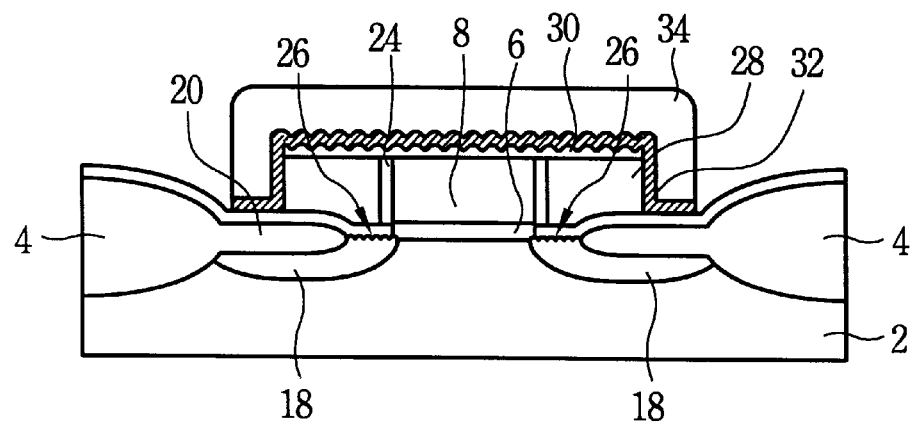
FIG. 12 is a cross sectional view of a semiconductor wafer illustrating the step of forming a control gate according to the present invention.

Referring to FIG. 11, an inter polysilicon dielectric (IPD) 32 is formed at the top of the defined floating gate for isolation. The ONO or NO film is used as the IPD 32. Finally, as can be seen by reference to FIG. 12, a conductive layer, such as n+ doped polysilicon layer 34, is formed on the IPD 32 as control gate. In addition, the metal, silicide or metal nitride compound or alloy layer can be used as the conductive layer. After the step, a patterning technique including lithography and etching processes is used to pattern the layers 34, 32, thereby forming the devices. The conductive layer acts as a control gate of the device.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:

forming a gate dielectric layer on said semiconductor substrate;

forming a first polysilicon layer on said gate dielectric;

forming a silicon nitride layer on said first polysilicon layer;

patterning said silicon nitride layer, said first polysilicon layer and said gate dielectric layer to form a gate structure on said semiconductor substrate;

performed a first thermal oxidation to form a first oxide layer on said semiconductor substrate exposed by said gate structure and simultaneously form a polyoxide on side walls of said gate structure;

forming isolating spacers on side walls of said gate structure;

performing an ion implantation to form source and drain of said nonvolatile memory in said semiconductor substrate;

performing a second thermal oxidation to form a second oxide layer on said semiconductor substrate exposed by said gate structure and said isolating spacers, wherein the dopants of said first ion implantation being driven into said semiconductor substrate;

removing said silicon nitride layer, said isolating spacers, then removing said polyoxide layer and said gate oxide that is uncovered by said gate structure;

forming undoped silicon layer along a surface of said gate structure and said second oxide layer;

performing a third thermal oxidation to convert said undoped silicon layer into a third oxide layer having textured interface between said semiconductor substrate and said third oxide layer;

forming a second polysilicon layer on said third oxide layer;

performing a chemical mechanical polishing to polish a portion of said second polysilicon layer and the top of said third oxide on said gate structure thereby exposing said gate structure, wherein said second polysilicon is separated into two parts adjacent to said gate structure in a cross-sectional view;

forming a rugged conductive layer on said polished second polysilicon layer and on said gate structure, wherein said rugged conductive layer, said polished polysilicon layer and said gate structure are used as a floating gate;

patterning said rugged conductive layer, said polished second polysilicon layer to define a floating gate of said nonvolatile memory;

forming an inter poly dielectric layer on said floating gate; and forming a third polysilicon layer on said inter poly dielectric layer, wherein said third polysilicon layer is used as a control gate of said nonvolatile memory.

2. The method of claim 1, wherein said isolating spacers are composed of silicon nitride.

3. The method of claim 1, wherein said first thermal oxidation is performed in $N_2O$ ambient.

4. The method of claim 1, wherein said first thermal oxidation is performed in NO ambient.

5. The method of claim 1, wherein said first thermal oxidation is performed in $N_2$ and $O_2$ ambient.

6. The method of claim 1, wherein said first thermal oxidation is performed at a temperature about 700 to 1150 degrees centigrade.

7. The method of claim 1, wherein said isolating spacers are removed by using hot phosphorus acid solution.

8. The method of claim 1, wherein said silicon nitride layer is removed by using hot phosphorus acid solution.

9. The method of claim 1, wherein said polyoxide layer is removed by using HF solution or BOE solution.

10. The method of claim 1, wherein said gate oxide is removed by using HF solution or BOE solution.

11. The method of claim 1, wherein said third thermal oxidation comprises dry oxidation.

12. The method of claim 11, wherein said third thermal oxidation is performed in $O_2$ ambient.

13. The method of claim 11, wherein said third thermal oxidation is performed at a temperature about 700 to 1000 degrees centigrade.

14. The method of claim 1, wherein said undoped silicon layer comprises amorphous silicon.

15. The method of claim 1, wherein said undoped silicon layer comprises hemispherical grained silicon.

16. The method of claim 14, wherein said amorphous silicon is formed at a temperature about 400 to 600 degrees centigrade.

17. The method of claim 14, wherein said amorphous silicon is formed in an ambient containing $SiH_4/N_2$.

18. The method of claim 14, wherein said amorphous silicon is formed to have a thickness about 20 to 100 angstroms.

19. The method of claim 1, wherein said rugged conductive layer comprises hemispherical grained silicon.

20. The method of claim 1, wherein said inter poly dielectric layer is selected from the group consisting of NO and ONO.

21. The method of claim 1, wherein said gate dielectric layer comprises oxide.

22. The method of claim 1, wherein said gate dielectric layer comprises silicon nitride formed by jet vapor deposition.

* * * * *